(12) United States Patent
Savage

(10) Patent No.: US 7,085,177 B2
(45) Date of Patent: Aug. 1, 2006

(54) MAXIMUM SWING THIN OXIDE LEVELSHIFTER

(75) Inventor: Scott C. Savage, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/955,663

(22) Filed: Sep. 30, 2004

(65) Prior Publication Data

US 2006/0067140 A1    Mar. 30, 2006

(51) Int. Cl.
*G11C 7/00* (2006.01)
(52) U.S. Cl. .................. 365/189.11; 326/63; 327/333; 365/190
(58) Field of Classification Search .......... 365/189.11, 365/190; 326/63; 327/333
See application file for complete search history.

(56) References Cited

U.S. PATENT DOCUMENTS 5,377,143 A * 12/1994 McClure ................ 365/189.02
6,300,796 B1 * 10/2001 Troutman et al. ............. 326/81
6,801,181 B1 * 10/2004 Matsumoto et al. ........ 327/333

* cited by examiner

*Primary Examiner*—Tuan T. Nguyen
(74) *Attorney, Agent, or Firm*—Christopher P. Maiorana, P.C.

(57) ABSTRACT

An apparatus comprising a first transistor pair, second transistor pair, a third transistor pair and a fourth transistor pair. The first transistor pair may be (i) implemented as thin oxide devices and (ii) configured to receive a differential input signal. The second transistor pair may be (i) implemented as thick oxide devices and (ii) configured to generate a differential output signal in response to the differential input signal. The output signal has a voltage higher than the input signal. The third transistor pair may be (i) connected between the first and second transistor pairs and (ii) configured to protect the first transistor pair. The fourth transistor pair may be (i) connected between the third transistor pair and a ground and (ii) configured to increase an operating speed of the apparatus.

13 Claims, 4 Drawing Sheets

MAXIMUM SWING THIN OXIDE LEVELSHIFTER

FIELD OF THE INVENTION

The present invention relates to level shifters generally and, more particularly, to a method and/or apparatus for implementing a level shifter that limits the maximum swing on thin oxide devices within the level shifter.

BACKGROUND OF THE INVENTION

Levelshifters are used to translate digital signals from one level to another level. Level shifters are often used to shift core levels to I/O levels (e.g., from a 1v domain to a 3.3v domain). Levelshifters are typically used in I/Os and mixed signal cores. Virtually any integrated circuit (IC) that has more than one voltage supply domain (i.e., 1v, 1.2v, 2.5v, 3.3v, etc.) will use a levelshifter of some sort.

Referring to FIG. 1, a diagram of a circuit 10 is shown illustrating a conventional level shifter. The circuit 10 comprises a transistor pair Q1 and Q2, a transistor pair Q3 and Q4 and a transistor pair Q5 and Q6. The transistors Q1 and Q2 are shown implemented as thick oxide devices. The transistors Q3 and Q4 are shown implemented as thin oxide devices. The transistors Q5 and Q6 are shown implemented as thick oxide protection devices.

In one example, a supply voltage AVDD is 3.3v and an input signal IN and an input signal INZ (i.e., complementary digital signals) swing from 0v to 1v. When the signal IN is 1v, the signal INZ is 0v. Conversely when the signal IN is 0v, the signal INZ is 1v. A signal VBIAS is set with a voltage divider from the 3.3v supply at 1V+1 Vth, where Vth is the threshold voltage of the transistor Q5 (or the transistor Q6). Hence, the signal VBIAS is ~1.7V. When the signal IN=1V and the signal and INZ=0V, then a signal OUT=3.3V and a signal OUTZ=0V. Conversely when the signal IN=0V and the signal INZ=1V, then the signal OUT=0V and the signal OUTZ=3.3V. When the signal IN changes dynamically from 0 to 1v, and the signal INZ changes from 1 to 0v, the signal OUTZ is pulled low from current flowing through both the transistor Q4 and the transistor Q5 while the transistor Q2 pulls the signal OUT to 3.3V and turns off the transistor Q1. Similarly, when the signal IN changes from 1 to 0v, and the signal INZ changes from 0 to 1v, the signal OUT is pulled low from current flowing through the transistors Q6 and Q3 while the transistor Q1 pulls the signal OUTZ to 3.3V and turns off the transistor Q2. In such cases, the swing on the drains of the transistors Q3 and Q4 is limited to 1v.

Conventional level shifters address either speed issues or reliability issues, but not both. Since reliability is normally a higher concern over speed, speed is sacrificed by lowering voltages across core devices to less than the core voltage.

It would be desirable to implement a level shifter that maximizes speed while limiting voltage stress on thin oxide devices within the level shifter to safe levels.

SUMMARY OF THE INVENTION

The present invention concerns an apparatus comprising a first transistor pair, second transistor pair, a third transistor pair and a fourth transistor pair. The first transistor pair may be (i) implemented as thin oxide devices and (ii) configured to receive a differential input signal. The second transistor pair may be (i) implemented as thick oxide devices and (ii) configured to generate a differential output signal in response to the differential input signal. The output signal has a voltage higher than the input signal. The third transistor pair may be (i) connected between the first and second transistor pairs and (ii) configured to protect the first transistor pair. The fourth transistor pair may be (i) connected between the third transistor pair and a ground and (ii) configured to increase an operating speed of the apparatus.

The objects, features and advantages of the present invention include implementing a level shifter that may (i) be used in I/Os and/or mixed signal cores, (ii) limit the maximum swing on thin oxide devices, (iii) consume a low power, and/or (iv) be implemented using a low chip area.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention is concerned with two main issues associated with conventional core to I/O levelshifters. A first problem is the maximum speed of the levelshifter. A second problem is the voltage stress across thin oxide devices in the levelshifter. To maintain maximum speed, a circuit architecture generally tries to maintain a core voltage across the core devices. However, for reliability concerns, the voltage across the thin oxide devices should always be maintained less than or equal to the maximum core voltage (since the devices will fail if the voltage across the devices is too high).

Figure 1:
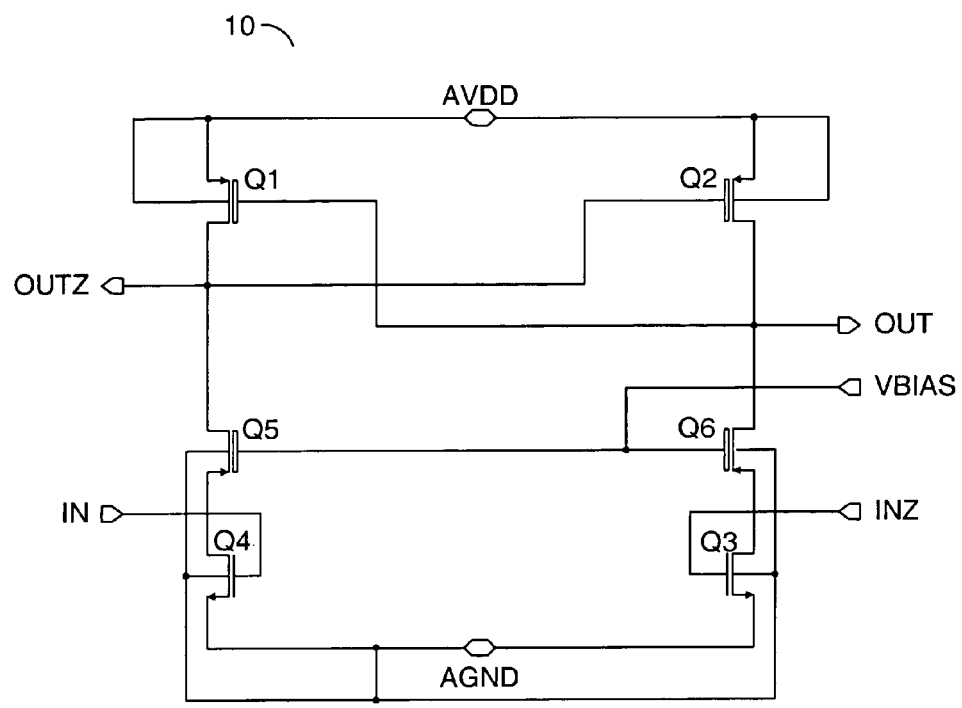
FIG. 1 is a diagram of a conventional level shifter.
Figure 2:
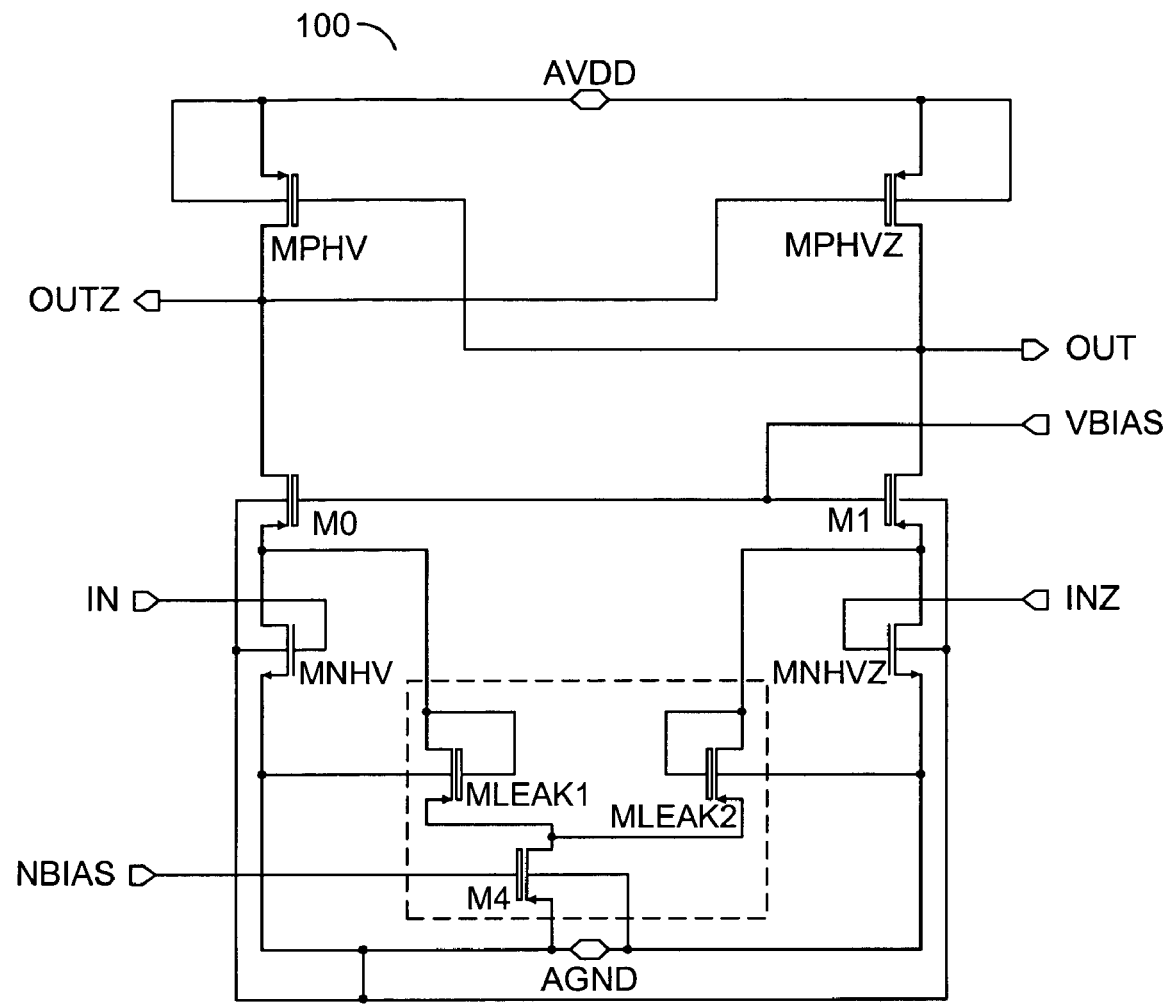
FIG. 2 is a diagram of a level shifter in accordance with a preferred embodiment of the present invention.

Referring to FIG. 2, a block diagram of a circuit 100 is shown in accordance with a preferred embodiment of the present invention. The circuit 100 may be implemented as a level shifter circuit. The circuit 100 generally comprises a pair of transistors MPHV and MPHVZ, a pair of transistors M0 and M1, a pair of transistors MNHV and MNHVZ, a transistor M4, and a pair of transistors MLEAK1 and MLEAK2. The transistors MPHV and MPHVZ are generally implemented as thick-oxide p-channel devices. The transistors M0 and M1 are generally implemented as thick-oxide n-channel devices. The transistors MNHV and MNHVZ may be implemented as thin oxide devices. The transistors M0 and M1 may be used to protect the transistors MNHV and MNHVZ. The transistor M4 may be implemented as a control transistor. A supply voltage (e.g., AVDD) is presented to a source of the transistor MPHV and a source of the transistor MPHVZ.

A signal (e.g., VBIAS) is typically presented to a gate of the transistor M0 and a gate of the transistor M1. The signal VBIAS is chosen to limit the voltage across the thin oxide devices MNHV and MNHVZ to a voltage less than a core voltage (e.g., VDDCORE, to be described in connection with FIG. 3) when no current flows through the transistors M0 or M1.

Without the transistors MLEAK1 and MLEAK2 and M4, the levelshifter 100 operates as a traditional levelshifter with the flaw that the voltages on the drains of the transistors MNHV and MNHVZ will be set to the core voltage VDDCORE (or lower) when no current flows through the transistors M0 and M1. Once current does flow through the transistors M0 or M1, an additional 100–300 mV will drop across the gate to source voltage (e.g., VGS) of the transistors M0 or M1 when in subthreshold conduction. The drop across the transistors M0 and M1 will be even larger when high currents (e.g., several milliamps or more) are present as the levelshifter circuit 100 toggles states on the output signals OUT and OUTZ. Such a 100–300 mV drop can significantly degrade the speed of the circuit 100 (e.g., how quickly the transistors MNHV and MNHVZ are able to toggle the signals OUTZ and OUT). However, the transistors MLEAK1 and MLEAK2 allow the transistors MNHV and MNHVZ to operate faster than a circuit implemented without the transistors MLEAK1 and MLEAK2.

Figure 3:
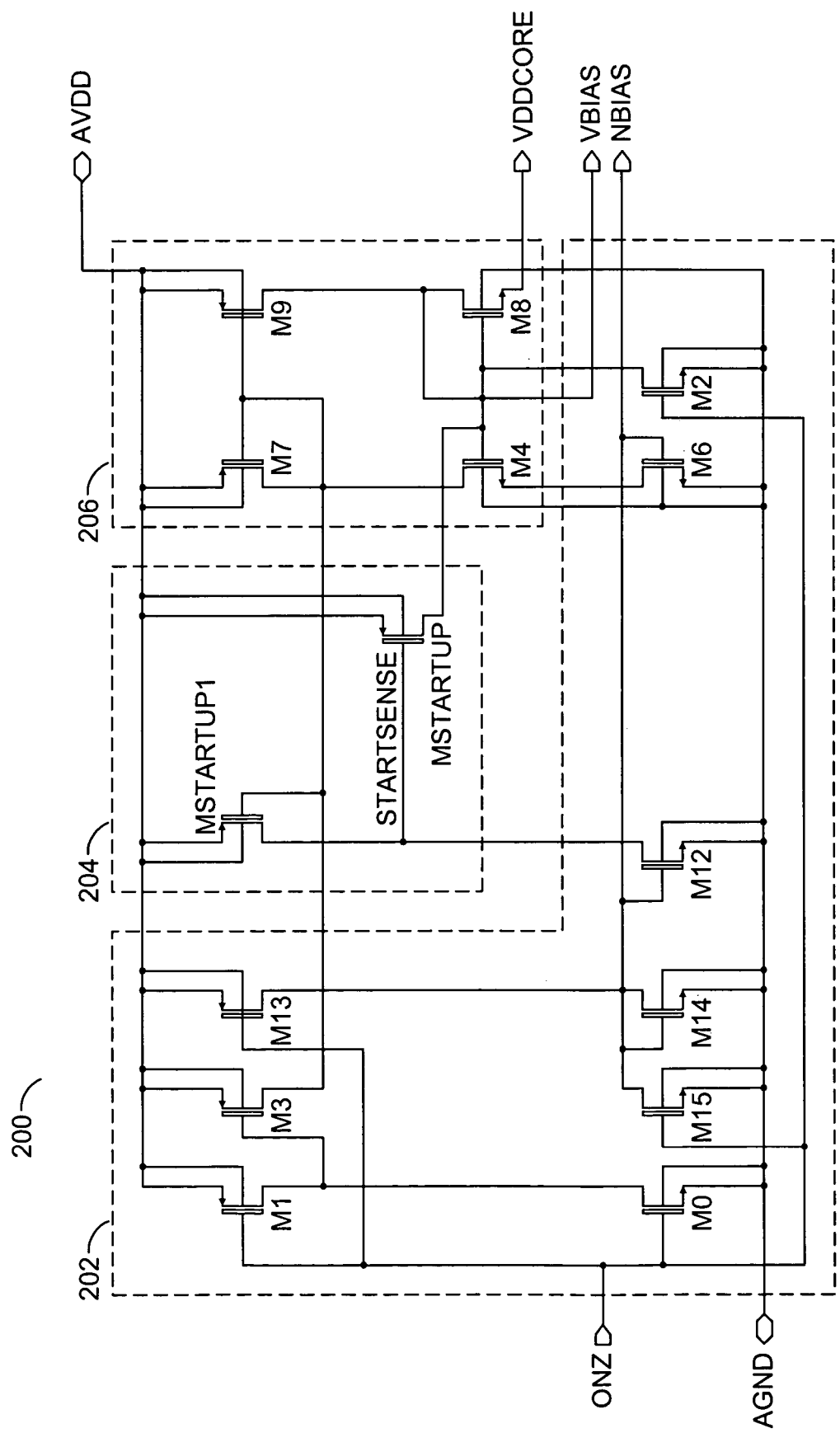
FIG. 3 is a diagram of a bias circuit.

Referring to FIG. 3, a diagram of a control circuit 200 is shown. The control circuit 200 may be used to generate the signal VBIAS and a signal NBIAS. The control circuit 200 generates the signals VBIAS and NBIAS in response to the supply voltage AVDD, the core voltage VDDCORE and the supply ground AGND. The signal VDDCORE is used to generate the signal VBIAS. A signal (e.g., ONZ) may be implemented as a powerup or powerdown signal (e.g., in one state the circuit 100 is enabled and in another state the circuit 100 is disabled).

The control circuit 200 generally comprises a bias circuit 202, a startup circuit 204 and a feedback loop 206. The feedback loop 206 generally comprises a number of transistors M4, M8, M7, and M9. The startup circuit generally comprises a transistor MSTARTUP1 and a transistor MSTARTUP2. The bias circuit generally comprises a number of transistors M0, M1, M2, M3, M6, M12, M13, M14 and M15. The transistor M13 may be configured as a triode resistor that produces a current through the transistor M14 to generate the bias signal NBIAS. The transistor M12 and the transistor M6 produce bias currents based on the transistor M14. The signals MSTARTUP and MSTARTUP1 may be used to ensure that the feedback loop 206 properly starts (e.g., within a predetermined time). When the source of the transistor M8 is tied to the core voltage VDDCORE (and is equal to 1V), the signal VBIAS will be forced by the feedback loop 206 to a voltage VGS above the voltage VDDCORE. The voltage VGS is based on the transistor M8 while conducting current in the range of several microamps. Hence, a subthreshold conduction drop is added into the signal VBIAS.

Referring back to FIG. 2, a gate of the transistor M4 is generally tied to the signal NBIAS (from FIG. 3). The transistor M4 will conduct current in the range of several microamps through either the transistor MLEAK1 or the transistor MLEAK2, depending on which one of the transistors MNHV or MNHVZ is off, respectively. For example, when the signal IN=0v, the signal OUTZ=3.3v, the signal INZ=1v, and the signal OUT=0v, the transistor M4 will act as a current source. The transistor M4 causes current to flow through the transistor MLEAK1 and the transistor M0 to hold the drain of the transistor MNHV at the core voltage VDDCORE via matching the voltage VGS of the transistor M8 (of FIG. 3) with the voltage VGS of the transistor M0 (of FIG. 2) referenced to the voltage VBIAS. Since the transistor MLEAK1 is configured as a diode connected device, the transistor MLEAK1 will only conduct current when the voltage on the drain of the transistor MNHV is above 800–900 mV. Therefore, the transistor MLEAK1 will not impede the dynamic operation of the levelshifter circuit 100 when the transistor MNHV tries to pull current through the transistor M0, since the transistor MLEAK1 will quickly turn off when the voltage at the drain of the transistor MNHV starts to drop.

The transistors MLEAK1, MLEAK2 and M4 are configured to prevent the voltage of the thin oxide devices MNHV and MNHVZ from exceeding the voltage VDDCORE by flowing current through the transistor M0 or M1 when the voltage at the drain of the transistors MNHV or MNHVZ approaches the core voltage VDDCORE (1V). When current flows through the transistors M0 or M1, the voltage VGS drop across either of the transistors M0 and M1 matches the drop across the transistor M8. The voltage drop VGS across the transistor M8 is referenced to the voltage VDDCORE.

Generally, the present invention uses feedback to accurately reproduce the voltage VDDCORE on the drains of the thin oxide devices MNHV and MNHVZ. Conventional solutions keep the voltage significantly less across the thin oxide devices due to the change in the voltage VGS of the thick oxide n-channel protection devices when no current flows (as mentioned above in subthreshold conduction).

The present invention keeps the maximum voltage across the thin oxide devices MNHV and MNHVZ high enough to achieve maximum speed in switching the signals OUT and OUTZ, but without damaging the transistors MNHV and MNHVZ. While the present invention has been described in connection with a supply voltage AVDD of 3.3v and a core voltage VDDCORE of 1v, other voltages may be implemented to meet the design criteria of a particular implementation.

Feedback allows for the replication of the voltage VDDCORE on the thin oxide transistors MNHV and MNHVZ rather than an inaccurate voltage divider off the 3.3v supply. The transistors MLEAK1 and MLEAK2 only turn on when the voltage across the thin oxide transistors near core voltage VDDCORE. The subthreshold voltage VGS is added to the voltage VBIAS to allow maximum voltage across the thin oxide transistors MNHV and MNHVZ. All these features may ensure reliability and maximum speed by keeping the maximum safe voltage across the thin oxide transistors MNHV and MNHVZ.

Figure 4:
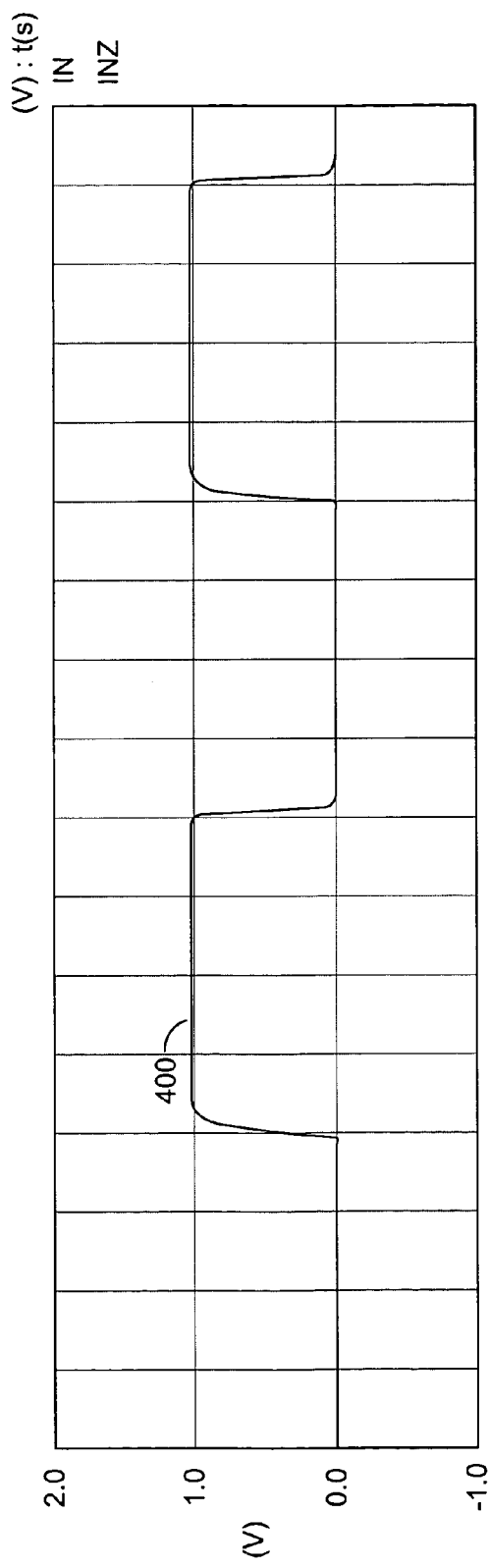
FIG. 4 is a plot of various waveforms of the circuit of FIG. 2.
Figure 4:
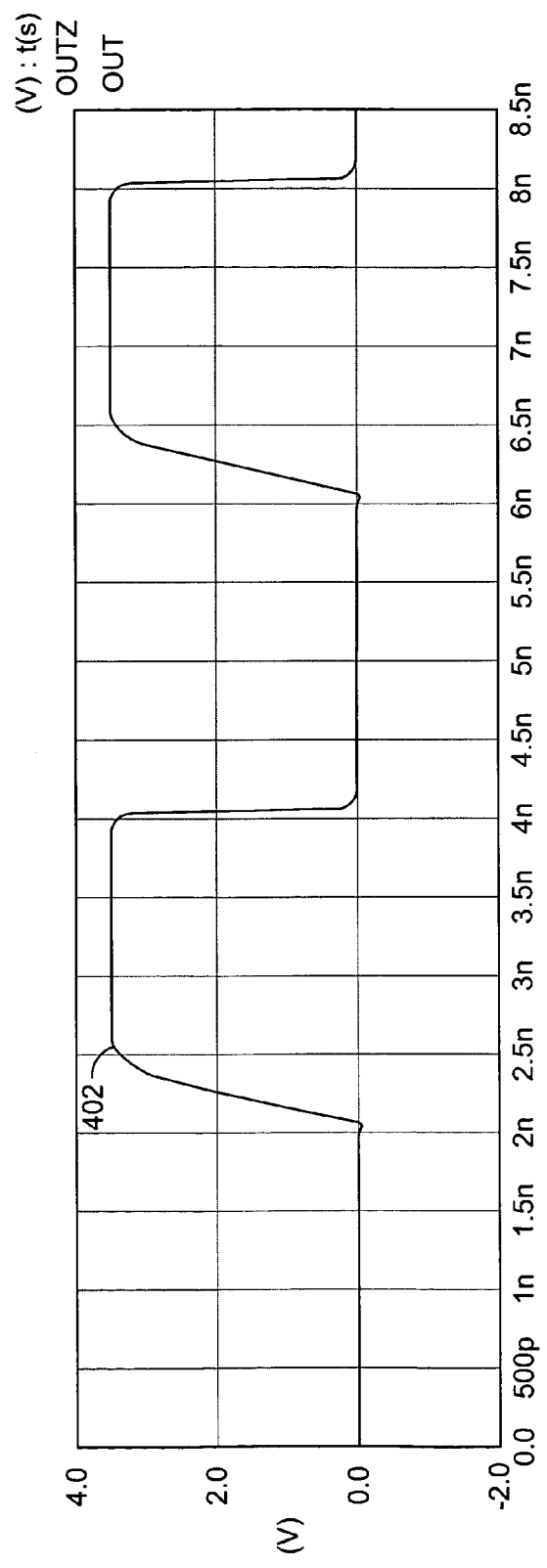

Referring to FIG. 4, a diagram illustrating one of the output signals OUT (or OUTZ) is shown. The waveform 400 illustrates one of the input signals IN (or INZ) of the circuit 100. The waveform 402 illustrates an output signal OUT (or OUTZ) of the circuit 100.

The circuit 100 may be used in I/Os and/or mixed signal cores. The circuit 100 may be useful anywhere a digital level translation is needed to translate from lower voltage levels to higher voltage levels. The present invention may be used in high speed transmit devices, such as USB 2.0 PHY devices.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a first transistor pair (i) implemented as thin oxide devices and (ii) configured to receive a differential input signal;
   a second transistor pair (i) implemented as thick oxide devices and (ii) configured to generate a differential output signal in response to said differential input signal, wherein said output signal has a voltage higher than said input signal;
   a third transistor pair (i) connected between said first and second transistor pairs and (ii) configured to protect said first transistor pair;
   a fourth transistor pair (i) connected between said third transistor pair and a ground and (ii) configured to increase an operating speed of said apparatus.

2. The apparatus according to claim 1, wherein said apparatus further comprises a control transistor connected between said fourth transistor pair and ground.

3. The apparatus according to claim 2, wherein said control transistor includes a gate connected to a bias signal.

4. The apparatus according to claim 1, wherein said fourth transistor pair is configured to limit a maximum swing on said first transistor pair.

5. The apparatus according to claim 1, wherein said apparatus further comprises a control circuit configured to present a voltage bias signal to said third transistor pair.

6. The apparatus according to claim 5, wherein said control circuit comprises a bias section, a feedback section and a startup section.

7. The apparatus according to claim 1, wherein said third transistor pair protects said first transistor pair by limiting a maximum voltage swing on said first transistor pair.

8. The apparatus according to claim 1, wherein said apparatus comprises a level shifter circuit.

9. The apparatus according to claim 1, wherein:
   said second transistor pair is implemented as thick oxide p-channel devices; and
   said third transistor pair is implemented as thick-oxide n-channel devices.

10. The apparatus according to claim 1, wherein said fourth transistor pair comprises diode connected devices.

11. An apparatus comprising:
    means for implementing a first transistor pair (i) as thin oxide device and (ii) configured to receive a differential input signal;
    means for implementing a second transistor pair (i) as thick oxide devices and (ii) configured to generate a differential output signal in response to said differential input signal, wherein said output signal has a voltage higher than said input signal;
    means for implementing a third transistor pair (i) connected between said first and second transistor pairs and (ii) configured to protect said first transistor pair;
    means for implementing a fourth transistor pair (i) connected between said third transistor pair and a ground and (ii) configured to increase an operating speed of said apparatus.

12. The apparatus according to claim 11, wherein said apparatus comprises a level shifter.

13. A method for implementing a level shifter comprising the steps of:
    (A) implementing a first transistor pair (i) as thin oxide device and (ii) configured to receive a differential input signal;
    (B) implementing a second transistor pair (i) as thick oxide devices and (ii) configured to generate a differential output signal in response to said differential input signal, wherein said output signal has a voltage higher than said input signal;
    (C) implementing a third transistor pair (i) connected between said first and second transistor pairs and (ii) configured to protect said first transistor pair;
    (D) implementing a fourth transistor pair (i) connected between said third transistor pair and a ground and (ii) configured to increase an operating speed of said level shifter.

* * * * *